United States Patent [19]
Efland et al.

[11] Patent Number: 5,585,657
[45] Date of Patent: Dec. 17, 1996

[54] WINDOWED AND SEGMENTED LINEAR GEOMETRY SOURCE CELL FOR POWER DMOS PROCESSES

[75] Inventors: Taylor R. Efland, Richardson; Roy C. Jones, III, Dallas, both of Tex.; Oh-Kyong Kwon, Seoul, Rep. of Korea; Michael C. Smayling, Missouri City; Satwinder Malhi, Garland, both of Tex.; Wai T. Ng, Ontario, Canada

[73] Assignee: Texas Instruments Incorporated, Dallas, Tex.

[21] Appl. No.: 358,631

[22] Filed: Dec. 19, 1994

Related U.S. Application Data

[63] Continuation of Ser. No. 171,878, Dec. 22, 1993, abandoned, which is a continuation of Ser. No. 869,582, Apr. 16, 1992, abandoned.

[51] Int. Cl.$^6$ ............................ H01L 29/78; H01L 29/72; H01L 21/265
[52] U.S. Cl. ........................ 257/335; 257/341; 257/401; 257/365; 257/343
[58] Field of Search ................................... 257/335, 341, 257/342, 343, 344, 401, 339, 365, 366, 372, 377

[56] References Cited

U.S. PATENT DOCUMENTS

| | | | |
|---|---|---|---|
| 3,926,694 | 12/1975 | Cauge et al. ............................ | 257/401 |
| 4,644,637 | 2/1987 | Temple ..................................... | 29/571 |
| 4,928,155 | 5/1990 | Nakagawa et al. ..................... | 257/341 |
| 5,079,602 | 1/1992 | Masana Harada ....................... | 257/341 |
| 5,105,243 | 4/1992 | Nakagawa et al. ..................... | 257/328 |

*Primary Examiner*—Robert P. Limanek
*Assistant Examiner*—Alexander Oscar Williams
*Attorney, Agent, or Firm*—Mark E. Courtney; W. James Brady, III; Richard L. Donaldson

[57] ABSTRACT

A source cell having reduced area and reduced polysilicon window width requirements for use as the source region in a DMOS transistor is disclosed, comprising: a source region of semiconductor material disposed on a semiconductor substrate; a plurality of backgate contact segments of predetermined size and separated by predetermined distances; and a plurality of source contact windows alternating with the backgate contact segments so that a narrow source contact region is formed of alternating source contact and backgate contact material. A DMOS transistor embodying the source region including the backgate contact segments and windowed source contacting regions of the invention is disclosed. An integrated circuit providing an array of DMOS transistors having the improved source regions of the invention is disclosed.

Other devices, systems and methods are also disclosed.

16 Claims, 6 Drawing Sheets

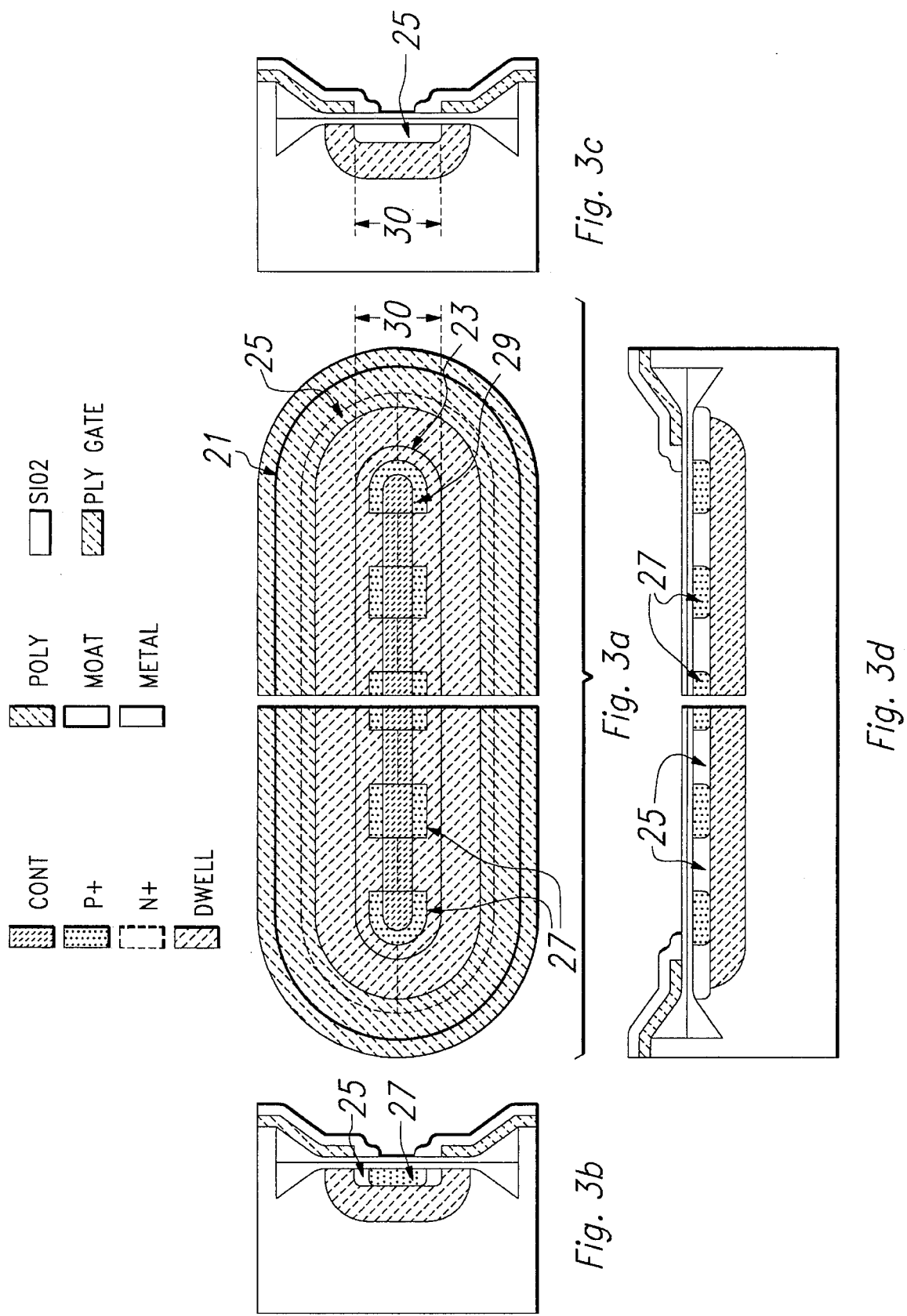

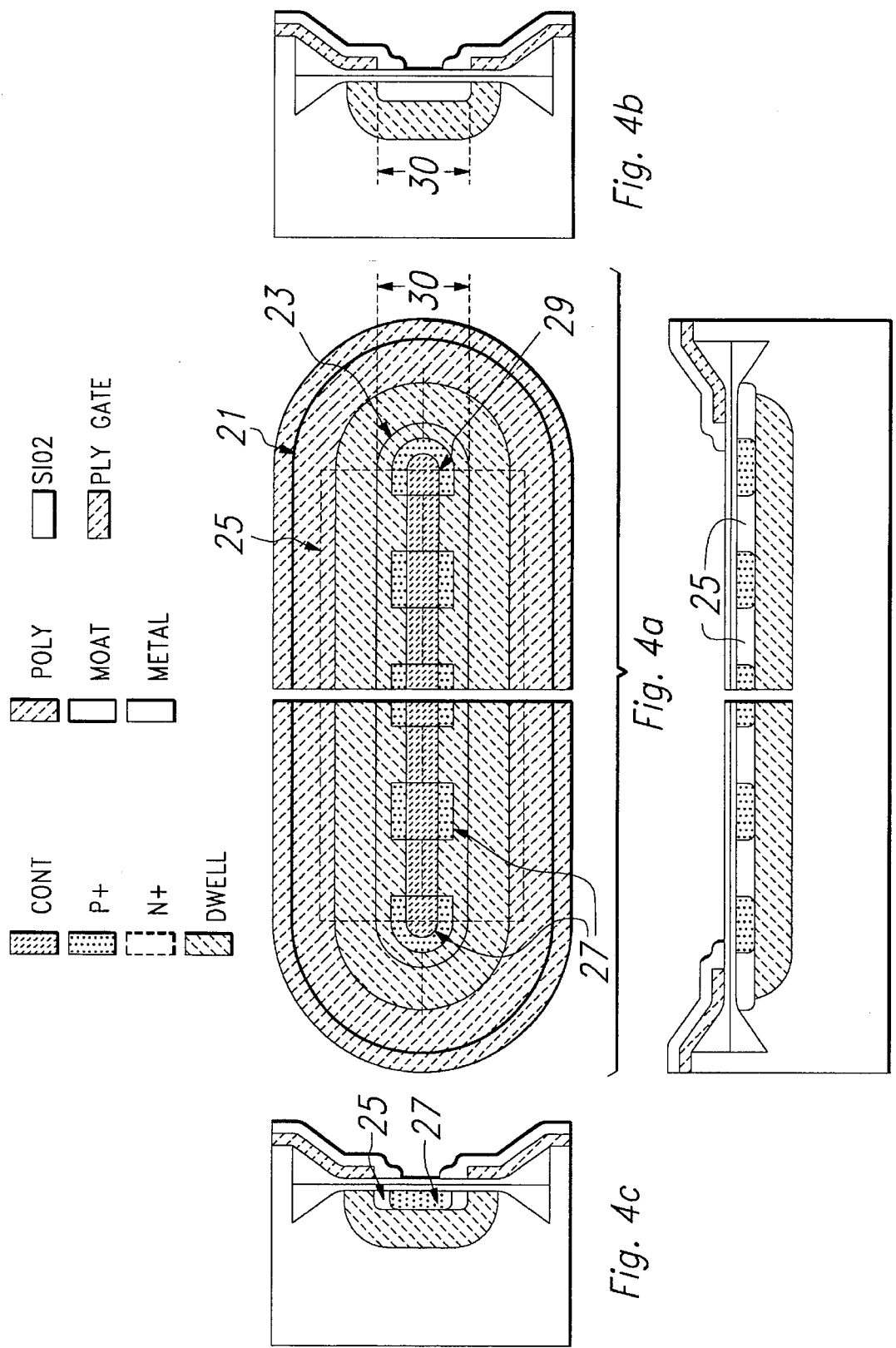

WINDOWED AND SEGMENTED LINEAR GEOMETRY SOURCE CELL FOR POWER DMOS PROCESSES

This application is a continuation of application Ser. No. 08/171,878, filed Dec. 22, 1993, now abandoned, which application is a continuation of application Ser. No. 07/869,582, filed Apr. 14, 1992, now abandoned.

FIELD OF THE INVENTION

This invention relates generally to programmable integrated circuits utilizing lateral double diffused MOS technology, and the application of linear geometry lateral DMOS cells and circuits to areas such as integrated circuits for power applications, circuits and systems.

BACKGROUND OF THE INVENTION

In producing integrated circuits for power applications it is typical to use a process utilizing a lateral double diffused MOS (LDMOS) technology. In designing a transistor cell for this technology, the size of the cell is limited in the prior art largely due to the need for a good source to backgate contact. In order to make this contact sufficiently efficient and of low impedance, the area of the cell must be large enough such that the figure of merit contact resistance is kept below a critical level. However, this cell size is a critical factor in producing smaller geometry circuits and improving the density of devices and efficient layout schemes. Therefore it is desirable to provide a transistor cell for a process using a lateral DMOS technology having smaller feature sizes for lower power consumption and better performance.

Heretofore, in this field, ICs using LDMOS processes have featured vertically integrated power DMOS devices mainly centered around hexagonal layouts and later square shaped cell layouts. These particular cell geometries have been found to offer reasonably large amounts of channel width for a given cell area. The hexagonal shaped cells are usually found in the vertical cell technologies. Alternatively, topside drain contact arrangements or updrain DMOS devices have been evolving from the vertical devices and can be characterized for the most part as lateral or semi-lateral devices. Semi-lateral DMOS devices have evolved out of the vertical DMOS devices, with the use of buried N+ material under cell arrays and deeply diffused N+ sinker regions between array cells. Square cell arrays have become the most popular cells in recent use since they are easily modeled as elaborate equivalent resistor networks, easy to array and nicely laid out.

However, the prior art approaches to improving cell sizing and spacing are limited to sizes needed for efficient source and backgate contacts along with process technology tolerances. The cell spacing and cell size is limited as a function of the minimum polysilicon window widths needed to make the required source-backgate contact while maintaining proper design rule spacing from the gate contact. A need for a cell which will allow smaller spacing and cell size with improved performance thus exists.

SUMMARY OF THE INVENTION

Generally, and in one form of the invention, a lateral DMOS process is used to produce a transistor cell. Other processes used to produce transistors are also compatible with the use of the invention, and the LDMOS transistor cell is disclosed by way of example. The LDMOS cell consists of P backgate and N source and drain regions separated by gate oxide regions, and having a segmented P+ material backgate contacting region inside windowed N+ source regions. An efficient source to backgate contact is made to the source and backgate regions in a much smaller area than for prior art approaches. Two advantages of the invention are an effective reduction in cell area and a corresponding reduction in polysilicon window widths. The reduction in cell area is accomplished with changes to the inactive area, so that the specific on resistance ($R_{SP}$) of the LDMOS cell is not affected.

The use of the invention results in large reduction in the figure of merit comprised of the product of the $R_{DSON}$ resistance and the cell area, ($R_{DSON}$ * AREA), commonly referred to as the specific on resistance, referred to herein as $R_{SP}$. The segmented backgate and windowed source provides a source and backgate contact along the length of the linear cell which results in reduced polysilicon window widths for the transistors implemented using the cell, while maintaining the efficient contact critical to cell performance. The use of the segmented and windowed areas results in a further advantage of a reduced cell pitch with increased performance, enabling production of highly integrated functions with reduced power consumption in LDMOS technologies. In addition, unlike prior art cell types the channel width is independent of cell pitch and remains constant for reductions in polysilicon window widths.

An additional embodiment is disclosed wherein an array of LDMOS linear cells having reduced cell pitch and using the segmented backgate and windowed source are produced as an integrated circuit which is programmable for user specified power circuitry. This integrated circuit enables the user to produce a high performance integrated circuit for a custom power IC application with reduced design time and accompanying reductions in production costs. Other applications will be obvious to the practitioner skilled in the art and are contemplated as well.

BRIEF DESCRIPTION OF THE DRAWINGS

In the drawings:

FIG. 3 depicts four views of the LDMOS source region of the linear cell of the invention showing segmented P+ and windowed N+ regions;

FIG. 3A is a top view;

FIG. 3B is a cross section through an area containing the segmented P+ backgate material;

FIG. 3C is a cross section through an area containing the windowed N+ material and not the P+ backgate material; and FIG. 3D is a cross section running lengthwise through the cell;

FIG. 4 depicts four views of an alternative layout for the DMOS source regions;

FIG. 4A depicts a top view of the source region;

FIG. 4B depicts a view in an area where the windowed N+ material is present;

FIG. 4C depicts a cross section running across the cell in an area where the segmented p+ backgate material is present; and FIG. 4D depicts a cross section running lengthwise through the cell;

Corresponding numerals and symbols in the different figures refer to corresponding parts unless otherwise indicated.

DETAILED DESCRIPTION OF PREFERRED EMBODIMENTS

Figure 1A:
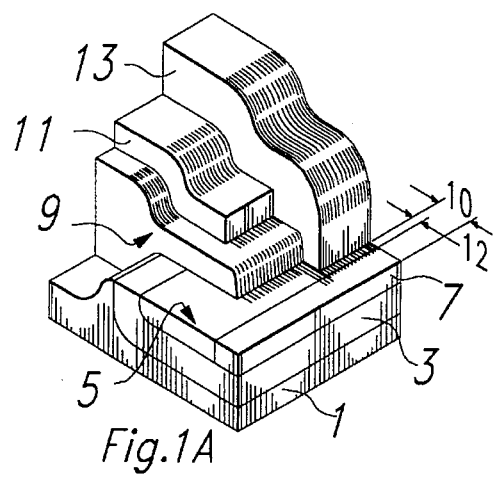
FIGS. 1a and 1b are two views of a segment of source and backgate regions of a square lateral DMOS cell as might be typically used in DMOS applications mentioned in the Background section without the invention.
Figure 1B:
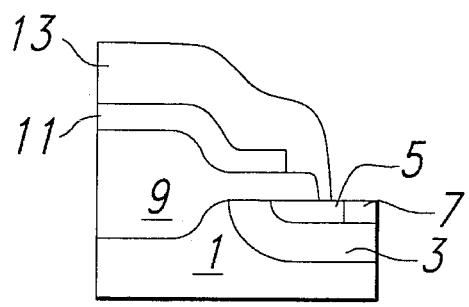

In FIG. 1, two views of a segment of a square linear cell for an LDMOS transistor are shown. In FIG. 1A, a three dimensional oblique view is shown, in FIG. 1B a planar cross section of the end region is shown.

In FIG. 1A, N type epitaxial layer or N well 1 has a P-type double diffused well (D-well) or body region 3 diffused into it. N+ source region 5 is then placed into the D-well region 3 by diffusion or implantation techniques, the placement being performed so that the distance between the edge of the source region 5 and the outside edge of the P type D well 3 is a predetermined distance. The D-well region 3 forms the backgate for the LDMOS transistor. Backgate contacting region 7 is a P+ type material which is diffused in so that it contacts the P type D well 3 and lies adjacent to the N+ source 5. Gate oxide 9 is grown onto the device, polysilicon gate 11 is deposited on the gate oxide, and interlevel isolation oxide 13 is placed on the gate 11. Contact area 10 is defined by the etched opening in oxide levels 13 and 9 to provide contact access to source region 5 and backgate 7. Spacing area 12 depicts the required spacing between contacting region 7 for the backgate material and isolation oxide level 13.

In making contact with the source and backgate regions, the contact region 10 will necessarily be wide enough to sufficiently contact the exposed area of N+ source 5 and the exposed backgate region 7. The design rules associated with the spacing 12 required to allow for a source contacting area in region 10, along with other required tolerances, result in a wide minimum polysilicon window width requirement. This polysilicon window width requirement limits the possible cell pitch and the overall density of the devices implemented in the technology. This is very important since a minimum cell pitch is desired.

Figure 2A:
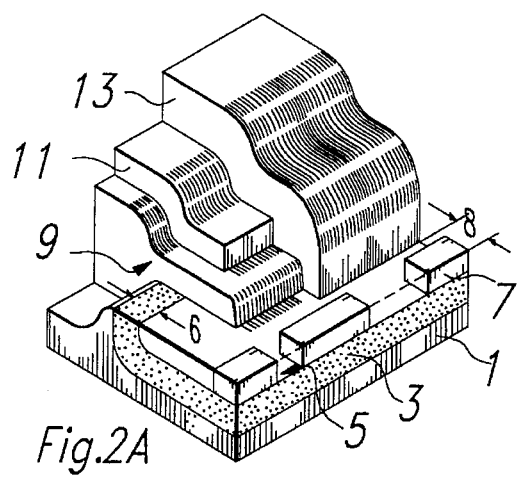
FIGS. 2a and 2b are two views of the source and backgate region of a lateral DMOS cell embodying the segmented backgate and windowed N+ source regions of the invention.
Figure 2B:
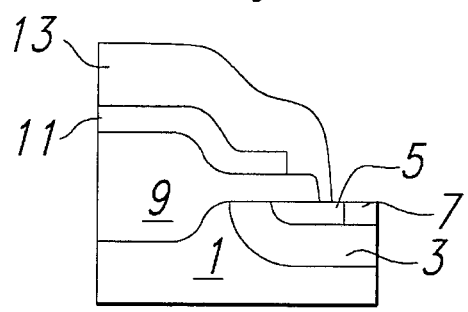

FIG. 2A and FIG. 2B are views of the lateral DMOS transistor cell similar to the cell of FIG. 1 and incorporating the segmented backgate and windowed N+ source regions of the invention. The backgate contacting region 7 is now formed of segments deposited into windowed areas of the source region 5. This allows a contact region 8 for contact to the source and backgate to be made by depositing metal on the area 8 where the segments and windows appear. Because the contact area 8 is smaller by the spacing amount 12 in FIG. 1A than the contact area of the cell produced without the invention, the minimum polysilicon window width requirement is reduced, which results in an improved cell spacing and density of the devices so implemented. Further, this source to backgate contact makes an excellent electrical contact to the source and backgate regions.

The similar backgate contact in the structure of FIG. 1 has to be wide enough to cover the non-segmented backgate region in FIG. 1 while making sufficient contact to the source region along side the non-segmented backgate region. As a result, the transistor cell in FIG. 1 will necessarily be wider than the segmented backgate cell of FIG. 2. This width requirement impacts the layout rules as a minimum width requirement of the polysilicon windows, and the cell of FIG. 1 will have a minimum window width substantially larger than the cell of FIG. 2. The result is that cells implemented using the segmented backgate as shown in FIG. 2 can achieve much denser arrangements with many more cells laid out in the same silicon area. To be exact the cell of FIG. 1A will be wider than that of FIG. 2a by two times the spacing distance 12 (2×12).

In operation, the source region having segmented P+ and windowed N+ shown in FIG. 2 is activated by applying a voltage to the polysilicon gate 11 which induces an inverted surface region in the backgate region 3. This inverted surface region forms the channel region 6. The inverted channel is the same conductivity type as the windowed N+ source region 5 and the drain region 1. With a voltage difference between the source and drain and the channel inverted, current will flow from the source to the drain. Under normal operating conditions the backgate region consisting of the D well region 3 and the segmented P+ regions 7 is shorted to or held at the same potential as the source region 5; however the backgate region carries no current in normal operation. Therefore it is only necessary to make contact to a sufficient amount of the N+ source so as to maintain a low on resistance.

Since the specific on resistance $R_{sp}=R_{on} * AREA$, the goal is to optimize $R_{on}$ by keeping it as low as possible for a given voltage range. For devices where the current flows directly from source to drain either on the surface (lateral devices) or through the wafer (vertical devices), $R_{on}$ is determined as a function of distance between the adjacent spacings of source to source regions for vertical devices and source to drain region spacing for lateral devices. Since the contacting region produces the least amount of resistance it is desirable to reduce this region as much as possible. Reduction in the N+ source contact region does not appreciably increase the on resistance; however it does significantly reduce the AREA part of the $R_{sp}$ product. By using a segmented P+ and windowed N+ source region in the LDMOS device, a sufficient amount of source area 5 is contacted so as not to significantly impact $R_{on}$ while the segmented P+ regions meet the backgate to source contact requirement.

This is best illustrated by comparing the typical device in FIG. 1 to the device embodying the invention depicted in FIG. 2. FIG. 1 shows a source region having a long P+ backgate contact region 7, which is necessary because it is also necessary to contact the source region 5. Contact region 10 has to be equal to the P+ region 7 plus an additional amount of spacing 12 to provide sufficient contact to the N+ source region. Because of symmetry, the width required has to have two times the spacing requirement 12 to provide sufficient contact area along with required alignment tolerances due to process lithography.

FIG. 2 illustrates the benefit of the invention in the preferred embodiment. The use of the segmented P+ and windowed N+ regions in the source region provides sufficient source contact in source region 5 and the required shorting to P+ region 7 without the added source spacing required by the prior art. In addition, this improvement is made independently of lithography alignment tolerances. The area part of the linear source cell is significantly reduced by the use of the invention, which results in a significant reduction in the figure of merit $R_{sp}=R_{on} * AREA$ without increasing the on resistance.

The evenly spaced segmented P+ regions depicted in FIG. 2 become important under reverse bias conditions where high reverse bias currents might flow. DMOS transistor source regions have a parasitic NPN transistor associated with them. This is depicted in FIGS. 2c and 2d. When the drain to backgate junction is reverse biased at a large enough voltage so that breakdown occurs, current flows across the PN junction. The current flows through the P backgate region, which acts as the base of the parasitic NPN, and out of the P+ contact region. If the voltage resulting from the current resistance product in the "base" region is greater than the forward voltage drop of the diode formed by the source backgate regions, the parasitic NPN will turn on. Turn on of the parasitic NPN generally leads to irreversible damage of the device. This phenomena is well known to those experienced in the art.

Figure 2C:
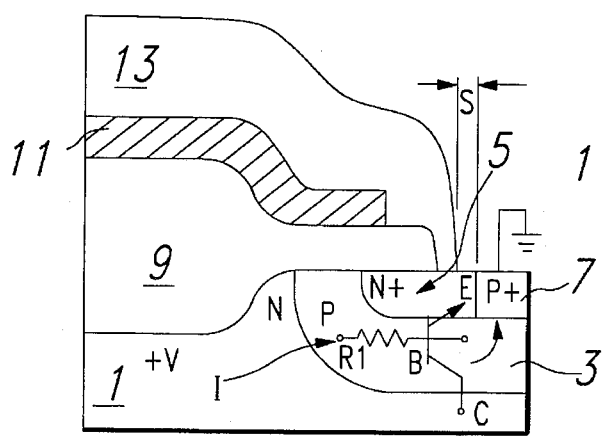
FIGS. 2c and 2d depict the parasitic NPN transistor effects which may arise under certain circumstances in operation of a LDMOS transistor without the invention and a transistor embodying the invention.
Figure 2D:
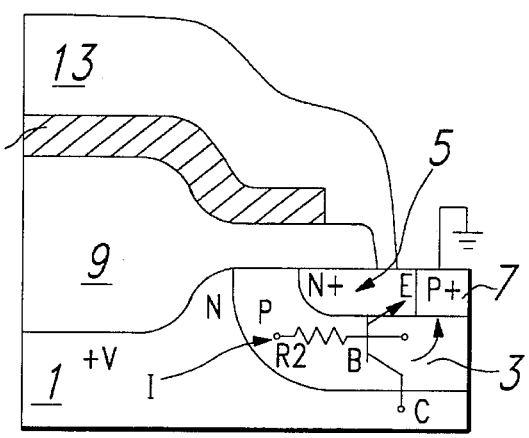

This latch up condition may be improved by reducing the distance through which current flows under the source region, which in effect reduces the resistance and the likelihood the parasitic NPN will turn on. FIG. 2c shows the parasitic NPN transistor as it occurs in a transistor produced without the invention as illustrated in FIG. 1. The resistance R1 represents the distance current flows under the source region, which acts as the emitter of the parasitic NPN. FIG. 2d depicts the parasitic as it occurs in the transistor of FIGS. 2a and 2b which embodies the invention. Because the distance current flows under the source region in FIG. 2d is greatly reduced by distance "S" in FIG. 2c, the "resistance" R2 is much less than R1 and the chance that the parasitic NPN will ever turn on is also reduced. In power IC technology this is described as extending the safe operating area. The safe operating area may be further improved by optimizing the lengths of the segments of P+ and their spacings in the windowed N+ regions. Reverse bias current is ballasted by the segmented P+ backgate as well.

Additional advantages of the cell depicted in FIG. 2 are that it has excellent operating characteristics. The critical performance parameter in a linear DMOS power transistor technology is the reduction in the figure of merit given by the "on" resistance, $R_{on}$, multiplied by the active area of the device, or $R_{on} * AREA=Rsp$. This figure of merit has limited the possibility to create smaller cells in those technologies using prior art layout techniques. The cell of FIG. 2, however, has excellent $R_{sp}$ characteristics. The active area of the cell is reduced because of the current flow patterns created by the windows in the source material interleaved with the segmented backgate. This is accomplished without any modifications to the resistance characteristic of the materials in the cell. The cell shown in FIG. 2 has been shown experimentally to produce transistors having excellent source contact, and a very efficient safe operating area, while exhibiting an $R_{DSON} * AREA$ figure of merit of approximately 1.34 milliohms $* cm^2$. This is believed to be lower than any other recorded values for a LDMOS designed cell. The devices also demonstrated 60 V breakdown voltages with 1 V threshold voltages which are excellent characteristics for this type of device. The safe operating area characteristics were shown to be free of common parasitic bipolar destruction caused from the turn-on of this parasitic device. This phenomena is a commonly observed problem in prior art devices.

The cell depicted in FIG. 2 also offers significant advantages and simplification having to do with the wafer fabrication technology. The windowed source regions 5 allow the use of standard backgate contacting implants used in VLSI technology. VLSI technologies comprised of CMOS or BiCMOS normally have source and drain contacting regions which have similar doping concentrations and penetrations for both N and P type conducting types. Because of this it is advantageous to window the source region 5 of one conducting type allowing the use of the other conducting type to form the backgate contacting segments 7. Without the windows in the source region 5, the backgate contacting segments 7 would necessarily have to have a much higher doping concentration to counter dope the source region. In addition the backgate contacting region would have to penetrate significantly deeper than the source region in order to make sufficiently good ohmic contact to the backgate region 3. Without the windowed source 5 regions, an additional and unique conductive region would have to be added to the fabrication process to form the backgate contacting regions 7. The use of the windowed source region 5 and the segmented backgate contacting regions 7, contained within the windows, allows for the use of standard CMOS source and drain conductivity types available in VLSI technologies. This in turn makes the preferred embodiment very suitable as an added component for VLSI technologies.

FIG. 3 depicts four layout views of the striped DMOS source of FIG. 2a and 2b showing segmented P+ and windowed N+ regions. FIG. 3A is the top layout view, FIG. 3B is a cross section of one of the segmented P+ regions, FIG. 3C is a cross section of one of the windowed N+ regions, and FIG. 3D is a cross section illustrating the segmenting and windowing of the P+ and source regions, respectively.

In FIG. 3A, the DMOS cell structure described in FIGS. 2A and 2B is depicted from a top view. Moat region 21 underlies the polysilicon gate region 23, windowed N+ region 25 and segmented P+ regions 27 are disposed as in FIG. 2. Contact 29 is made over the segmented backgate and windowed source regions as before, such that the contact can be made as narrow as the particular process technology allows. Use of the invention therefore leads to an optimally narrow cell pitch for the particular process, and allows minimum polysilicon window widths 30 for maximum cell density without sacrifice of device performance.

The segmented P+ region 27 includes a segment at both ends of the cell. This is important because it enhances break down characteristics and extends the safe operating area of the cell in the corner regions.

Cross section 3B is through one of the segmented P+ regions 27 of the cell and illustrates the contact opening for contacting the backgate material.

Cross section 3C illustrates an area of the cell where the N+ 25 is present and depicts the contact to the N+ source material.

Cross section 3D is a lengthwise cross section of the cell, and illustrates the disposition of the windowed N+ 25 and the segmented P+ 27 regions.

In the cell of FIG. 3, note that the windowed N+ region 25 continues into the ends of the cell. This is acceptable for larger cell polysilicon window widths, but compare this to the arrangement in FIG. 4 discussed below.

FIG. 4 depicts a topview layout arrangement for an alternative cell incorporating the invention. In the cell of FIGS. 4A–D, the windowed N+ region 25 does not continue into the ends of the cell. For small cells, the problems associated with corner and diffusion effects are critical. This is important for devices having small diffusion windows. This effect is known as source limitation and occurs in corner regions and small windows, and is well known in the art. The linear cell of FIG. 4 has no N+ source material at the end of the cell. By terminating the N+ regions before the end of the cell, corner effects such as low $V_T$ and early breakdown caused by the source limited diffusions associated with other cell types as mentioned earlier, are eliminated from the cell embodying the invention. If the window is large the importance of these effects is reduced and the early termination of the N+ regions may not be necessary, as shown in the embodiment of the invention in FIG. 3.

In FIG. 4A, the alternate DMOS cell structure is depicted from a top view. Moat region 21 underlies the polysilicon gate region 23, windowed N+ region 25 and segmented P+ regions 27 are disposed as in FIG. 3. Contact 29 is made over the segmented backgate and windowed source regions as before.

Cross section 4B is through one of the segmented P+ regions 27 of the cell and illustrates the contact opening for contacting the backgate material.

Cross section 4C illustrates an area of the cell where the N+ 25 is present and depicts the contact to the N+ source material.

Cross section 4D is a lengthwise cross section of the cell, and illustrates the disposition of the windowed N+25 and the segmented P+ 27 regions.

Figure 5A:
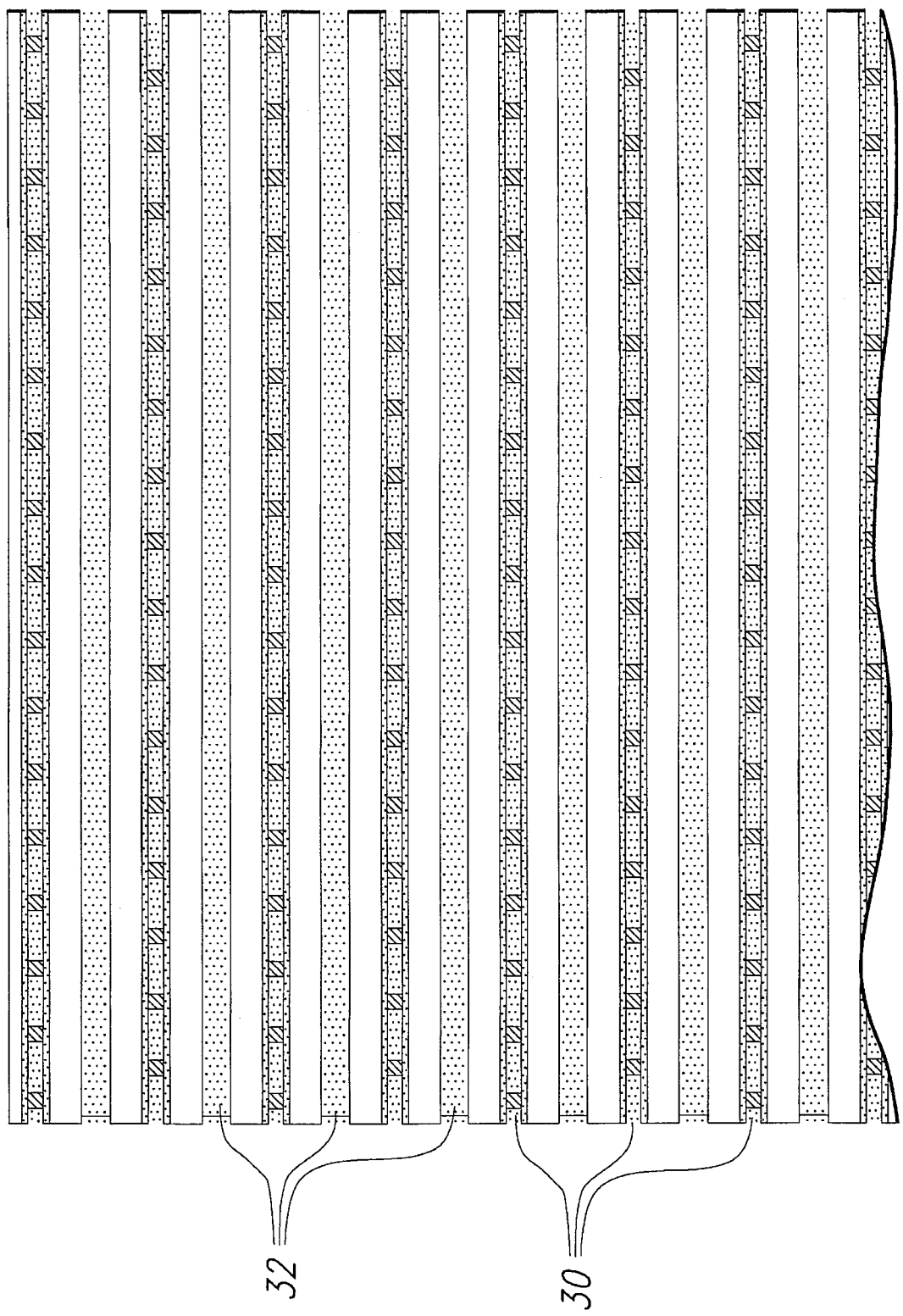
FIG. 5A depicts a top view of a lateral DMOS device having a linear source geometry and embodying the segmented and windowed regions of the invention.
Figure 5B:
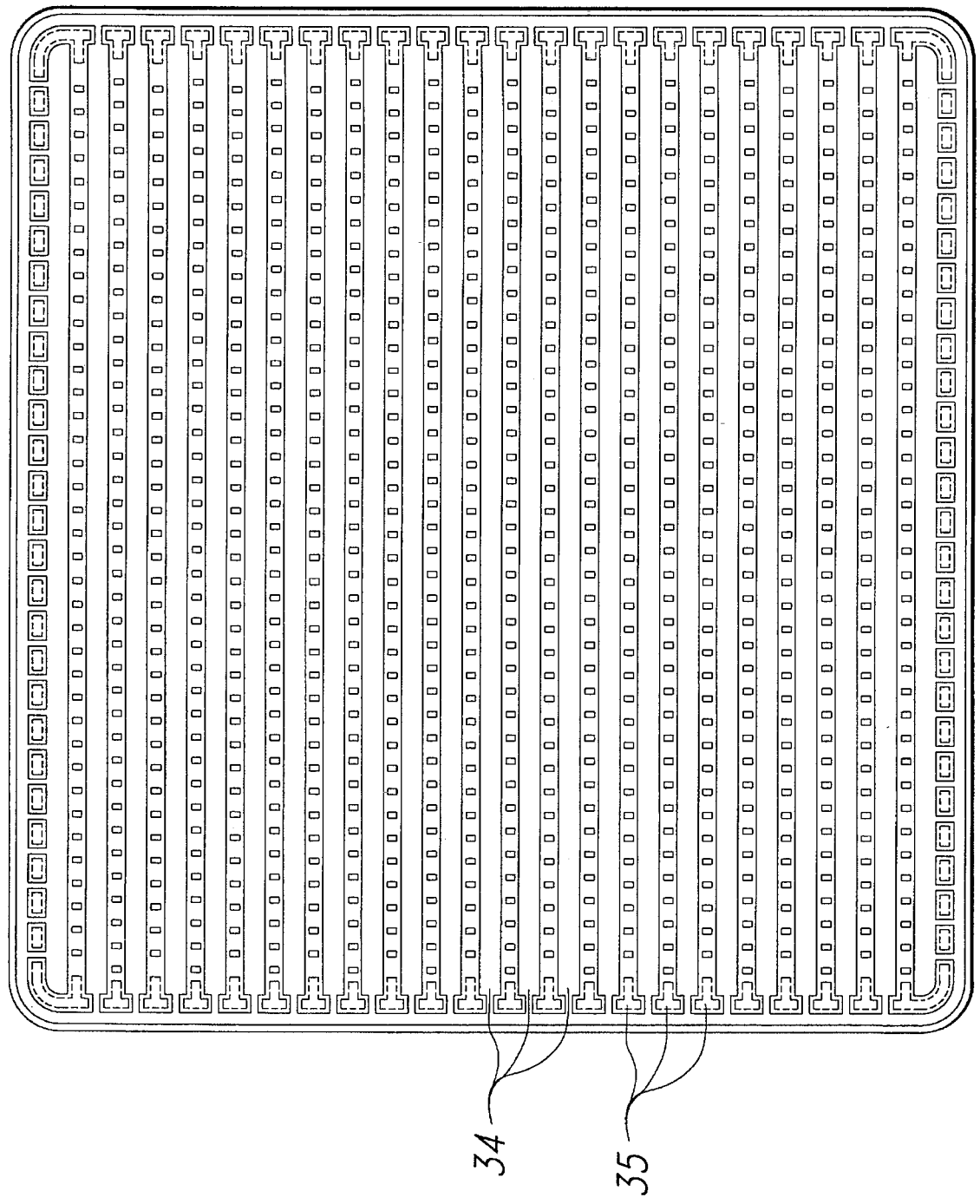
FIG. 5B depicts a top view of a vertical DMOS device embodying the invention.

The source/gate cell arrangement with segmented backgate depicted in FIGS. 3 and 4 can be used in many different technologies to produce transistors. In a topside drain device such as the lateral DMOS device of FIG. 3, a drain contacting region of N+ is diffused between the linear source cells. Such a device is shown in FIG. 5A. In FIG. 5A the linear geometry source cells 30 are arranged with alternating drain N+ regions 32 creating a lateral power DMOS structure. Current flows laterally on the surface between the source and drain regions. FIG. 5B illustrates the linear source cell singularly arrayed to create a vertical DMOS device. In the vertical device the drain region 34 is contacted at the back of the device and current flows through the device from source regions 35 to drain 34.

The segmented backgate and windowed source cell of FIGS. 2 and 3 can also be used in other processes, including semi-vertical DMOS devices, and Resurf (Reshaped Surface Field) forms for these devices. In vertical or semi-vertical devices, the cell of FIG. 2 offers more channel width for silicon area than a conventional square cell for devices having a cell to cell spacing greater than the cell size. The segmented backgate and windowed N+ source of the invention can also be used in multifunctional device flows such as vertical DMOS, semi-vertical DMOS and lateral DMOS of both conventional and resurf types.

Figure 6:
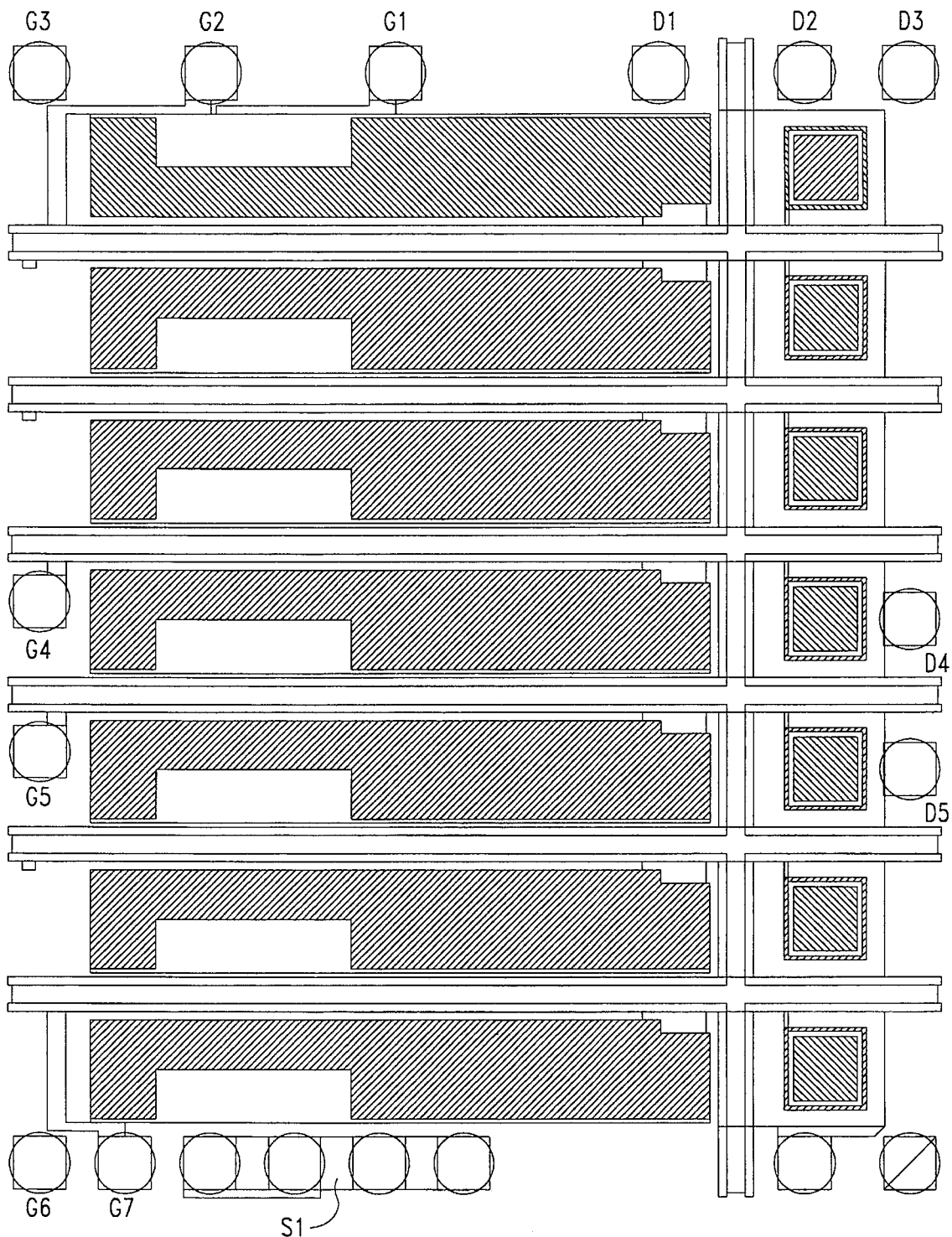
FIG. 6 depicts an IC consisting of an array of the linear transistor cells with the segmented backgate and windowed N+ of the invention.

FIG. 6 depicts an integrated circuit comprising device employing the linear DMOS cell of FIG. 2. An array of 7 transistor cells is constructed, each cell being formed with a segmented and windowed source region as described above. Signal pads G1–G7 allow contact to the gates of devices 1–7, and pads D1–D7 allow access to the drains of devices 1–7, respectively. Source pad S1 is a common source for the devices. The user can selectively interconnect the transistor cells in the array by programming or specifying connectivity circuitry among the pads in the array, and thereby form various functions as required by the user's application.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A source cell for use as the source region in a DMOS transistor, comprising:

a semiconductor substrate;

a body region of semiconductor material of a first conductivity type disposed on the surface of said semiconductor substrate;

a source region of semiconductor material of a second conductivity type disposed on the surface of said body region and partially overlying said body region, said source region being patterned to define a plurality of windows within said source region where said body region is exposed, said windows being surrounded by said semiconductor material of a second conductivity type;

a plurality of backgate contact segments of semiconductor material of said first conductivity type disposed within said windows in said source region and contacting said body region; and the source region between said windows in said source region forming a plurality of source contact regions of semiconductor material of said second conductivity type disposed between said ones of said plurality of backgate contact segments, the width of said source contact regions and said windows in said source region defining a source contact width requirement for a transistor.

2. The source cell of claim 1, wherein said source region is linear in geometry, so that the length is greater than the width.

3. The source cell of claim 1, wherein said backgate segments and source contact regions alternate and form a rectilinear source contact area within said source region.

4. The source cell of claim 1, wherein said semiconductor material of said first conductivity type comprises N type semiconductor material.

5. The source cell of claim 1, wherein said semiconductor material of said first conductivity type comprises P type material.

6. The source cell of claim 1, wherein said semiconductor material of said second conductivity type comprises N type material.

7. The source cell of claim 1, wherein said semiconductor material of said second conductivity type comprises P type semiconductor material.

8. A source contact for a DMOS transistor having reduced polysilicon window widths and decreased area, comprising:

a backgate region of semiconductor material of a first conductivity type disposed on a semiconductor substrate;

a source region of semiconductor material of a second conductivity type disposed within said backgate region and partially overlying said backgate region;

a source contact region formed within said source region and comprised of a plurality of windows in said source region, each of said windows containing a segment of backgate contact material of said first conductivity type that contacts said backgate region, each of said windows being of predetermined length and width and each being surrounded by said semiconductor material of said source region; and a metal source contact formed upon said source contact region such that the source contact electrically couples said windows of backgate contact material and said source region material and further couples said source region and said backgate region to each other and to said source contact, the width of said metal source contact being determined by the width of the windows in said source contact region.

9. The source contact of claim 8, wherein said source region is rectilinear in shape, its length being a predetermined distance which is greater than its width.

10. The source contact of claim 8, wherein said source contact region is rectilinear in shape and said windows of backgate contact material and said source region material alternate and form a narrow rectangle.

11. A DMOS transistor having reduced polysilicon window width and decreased area, comprising:

a semiconductor substrate;

a drain region comprised of a semiconductor material of a first conductivity type, disposed into said semiconductor material at the surface of said semiconductor material;

a backgate region comprised of a semiconductor material of a second conductivity type, disposed in said semiconductor substrate a predetermined distance from said drain region;

a source region comprised of semiconductor material of said first conductivity type disposed at the surface of said backgate region and partially overlying said backgate region;

a gate oxide region disposed over said source and drain regions and partially overlying said source and drain regions;

a polysilicon gate region overlying said gate oxide region; and a source contact region within said source region comprised of alternating segments of source contact material and windows in said source region, said windows being voids surrounded by said semiconductor material of said first conductivity type and extending through said source region and being filled with backgate contact material, so that said source contact material is coupled to said source region, said source contact region partially overlying said backgate region so that said segments of backgate contact material are overlying and coupled to said backgate region, the width of said source contact region being determined by the width of said windows in said source region.

12. The DMOS transistor of claim 11, wherein said source region is of a narrow rectilinear shape of a predetermined area, so that the length of said source region greatly exceeds its width.

13. The DMOS transistor of claim 11, wherein said source contact region is comprised of narrow segments of backgate contacting material alternating and contained within narrow windows of source contact material such that said source contact is a narrow rectangle of said alternating segments and windows, its length greatly exceeding its width.

14. The DMOS transistor of claim 11, wherein said drain region further comprises a top-side drain contact disposed on the surface of said semiconductor substrate at a predetermined distance from said source region and said gate oxide regions, thereby forming a lateral DMOS transistor structure.

15. The DMOS transistor of claim 11, wherein said drain region further comprises a drain contact disposed underneath said semiconductor substrate, thereby forming a vertical DMOS transistor structure.

16. A cell structure for a lateral DMOS transistor having an optimally narrow source and backgate contact width, comprising:

a semiconductor substrate;

a drain region comprised of a semiconductor material of a first conductivity type, disposed into said semiconductor material;

a source region comprised of a semiconductor material of said first conductivity type, disposed into said semiconductor material at a predetermined distance from said drain region;

a backgate region comprised of a semiconductor material of a second conductivity type, disposed into said semiconductor substrate and partially underlying said source region;

a gate oxide region disposed over said source and drain regions and partially overlying said source and drain regions;

a polysilicon gate region overlying said gate oxide region;

a source contact region comprised of alternating segments of backgate contact material and source contact material, said segments of backgate contact material contained inside windows formed within and surrounded by source contact material disposed onto said semiconductor substrate and lying adjacent said source region so that said source contact material is coupled to said source region, said source contact region partially overlying said backgate region so that said segments of backgate contact material are overlying and coupled to said backgate region; and said source contact region being as fabricated with as narrow a width as possible with the chosen process technology, enabling the source contact region to be of optimally narrow width.,.said width of said source contact region being determined by the width of said alternating segments of backgate contact material and said source contact material.

* * * * *